United States Patent [19]
Aisou

[11] Patent Number: 6,074,925
[45] Date of Patent: Jun. 13, 2000

[54] METHOD FOR FABRICATING SEMICONDUCTOR DEVICE WITH POLYCIDE STRUCTURE FOR ELECTRODE OR INTERCONNECT

[75] Inventor: Fumiki Aisou, Tokyo, Japan

[73] Assignee: NEC Corporation, Tokyo, Japan

[21] Appl. No.: 08/653,327

[22] Filed: May 24, 1996

[30] Foreign Application Priority Data

May 24, 1995 [JP] Japan .................................. 7-124892

[51] Int. Cl.[7] .................................................. H01L 21/283
[52] U.S. Cl. .................. 438/365; 438/586; 438/592; 438/649; 438/653; 438/655; 438/660; 438/683; 148/DIG. 19; 148/DIG. 122; 148/DIG. 147
[58] Field of Search ...................... 437/160, 162, 437/193, 200; 438/365, 586, 592, 649, 653, 655, 660, 683; 148/DIG. 19, DIG. 122, DIG. 147

[56] References Cited

U.S. PATENT DOCUMENTS

| | | | |
|---|---|---|---|
| 4,549,914 | 10/1985 | Oh | 148/187 |
| 4,569,701 | 2/1986 | Oh | 148/188 |
| 4,584,760 | 4/1986 | Okazawa . | |
| 4,977,098 | 12/1990 | Yu et al. | 437/200 |
| 5,192,708 | 3/1993 | Beyer et al. | 437/203 |
| 5,315,140 | 5/1994 | Sugahara et al. | 257/306 |
| 5,318,919 | 6/1994 | Noguchi et al. | 437/101 |
| 5,510,296 | 4/1996 | Yen et al. | 437/200 |
| 5,543,347 | 8/1996 | Kawano et al. | 437/200 |

FOREIGN PATENT DOCUMENTS

| | | |
|---|---|---|
| 1-184846 | 7/1989 | Japan . |
| 1-241125 | 9/1989 | Japan . |
| 2-042718 | 2/1990 | Japan . |
| 6-132245 | 5/1994 | Japan . |
| 8-083778 | 3/1996 | Japan . |
| 8-083851 | 3/1996 | Japan . |

OTHER PUBLICATIONS

Wolf and Tauber, "Silicon Processing for the VLSI Era vol. 1: Process Technology", Lattice Press, pp. 181–182, 1986.

*Primary Examiner*—David E. Graybill
*Attorney, Agent, or Firm*—Sughrue, Mion, Zinn, Macpeak & Seas, PLLC

[57] ABSTRACT

The method for fabricating a semiconductor device includes steps of forming a layered structure by sequentially depositing a silicon film containing an impurity, a metal silicide film, and an amorphous silicon film containing an impurity, forming an electrode or an interconnect in a three-layer structure by selectively etching the amorphous silicon film, the metal silicide film and the silicon film in this order, and diffusing the impurity in the amorphous silicon film into the metal silicide film by a thermal process. Thus, the impurity is supplied from the amorphous silicon film to the metal silicide film so that the ion-implantation as required in the prior art is not necessary.

17 Claims, 3 Drawing Sheets

METHOD FOR FABRICATING SEMICONDUCTOR DEVICE WITH POLYCIDE STRUCTURE FOR ELECTRODE OR INTERCONNECT

BACKGROUND OF THE INVENTION

(1) Field of the Invention

The present invention relates to a method for fabricating a semiconductor device, and more particularly to a method for fabricating a semiconductor device having a polycide structure for electrodes or interconnects.

(2) Description of the Related Art

In the field of silicon semiconductor integrated circuits, application of metal silicide films whose resistivity is low and melting point is high is diversified. For example, in the DRAM (Dynamic Random Access Memory) used nowadays, the interconnects for memory cell portions such as gate electrodes (word interconnects) of a transistor and bit interconnects require the films having low resistance and high melting point due to the scaling down of the widths of interconnects necessitated by design rules. Accordingly, metal silicide films are widely used for the gate electrodes, the bit interconnects, etc.

Also, the characteristic of the recent metal silicide interconnect is that, in most cases, it is in the form of a polycide structure in which the entire surface or a part of the metal silicide film is in contact with a silicon film containing impurities, and the metal silicide film and the silicon film constitute a layered structure (polycide structure).

Sequential steps of a method for fabricating a prior art semiconductor device of the kind to which the present invention relates are shown in FIGS. 1A–1D.

As shown in FIG. 1A, a surface of a silicon substrate 1 is thermally oxidized by a local oxidation process (LOCOS) whereby a field oxide film 2 of 0.3 µm thick is formed so as to define an element formation region. Then, after a gate oxide film 3 of 10 nm thick is formed by thermally oxidizing a surface of the silicon substrate at the element formation region, a phosphorus (P) doped silicon film 4 of 0.1 µm thick and a tungsten silicide film 5 of 0.1 µm are sequentially deposited and stacked on the entire surface. On the resulting entire surface, phosphorus ions are implanted at an acceleration energy of 30 keV and with a dose of $5 \times 10^{15}$ cm$^{-2}$. The purpose of this ion implantation is to prevent the lowering of the phosphorus concentration in the silicon film. That is, the phosphorus in the silicon film of the layered polycide structure in which the phosphorus doped silicon film and the tungsten silicide film are stacked is diffused into the tungsten silicide film resulting in extremely lowering the phosphorus concentration in the silicon film containing the phosphorus. In an attempt to overcome this problem, the phosphorus is ion-implanted with such an energy that allows the phosphorus to reach the interface between the silicon film containing the phosphorus and the tungsten silicide so that a sufficient amount of phosphorus is added in advance into the tungsten film.

As shown in FIG. 1B, the tungsten silicide film 5 and the silicon film 4 are selectively and sequentially etched whereby a gate electrode is formed.

Next, as shown in FIG. 1C, by using the gate electrode and the field oxide film 2 as masks, a diffusion layer 7 is formed by impurity ion-implantation in a surface portion of the silicon substrate 1 at the element formation region, and an interlayer insulating film 8 of 0.8 µm thick is deposited by a CVD process on a surface including that of the gate electrode. Then, the interlayer insulating film 8 is selectively anisotropically etched whereby a contact hole 11 is formed.

Thereafter, as shown in FIG. 1D, on a surface of the interlayer insulating film 8 including a surface of the contact hole 11, a phosphorus doped silicon film 12 of 0.1 µm thick and a tungsten silicide film 13 of 0.2 µm thick are sequentially deposited and stacked and, on the entire surface, phosphorus ions are implanted at an acceleration energy of 50 keV and with a dose of $5 \times 10^{16}$ cm$^{-2}$ and, thereafter, the tungsten silicide film 13 and the silicon film 12 are selectively sequentially etched thereby forming bit lines in the polycide structure.

In the prior art method for fabricating the semiconductor device explained above, in order to prevent the lowering of the conductivity caused by the diffusion, into the silicide film, of the impurity in the silicon film of the electrodes or interconnects in the polycide structure, the impurity is ion-implanted near the interface between the silicon film and silicide film. However, a problem is associated with the polycide structure in which films are formed thin in order to minimize the step formation. The silicon film containing the impurity and disposed under the silicide film tends to become thinner than the silicide film, the impurity ions, although intended to be implanted to near the interface, spread through to the gate insulating film due to implantation energy variations, or due to the breakdown voltage of the gate insulation being lowered as a result of the charge up effect caused by the ion charges.

A further problem is that, since the reflectivity to the exposure wavelength of the silicide film is large so as to cause halation to occur, a pattern precision during the lithography process is lowered leading, in a worst case, to the occurrence of electrical shorts among interconnects.

SUMMARY OF THE INVENTION

An object of the present invention, therefore, is to overcome the problems existing in the prior art, and to provide a method for fabricating a semiconductor device in which it is possible to prevent the lowering of the breakdown voltage and of the patterning precision during the fabrication.

According to one aspect of the present invention, there is provided a method for fabricating a semiconductor device comprising the steps of:

forming a layered structure by sequentially depositing a silicon film containing an impurity, a metal silicide film, and an amorphous silicon film containing an impurity:

forming a three-layer structure by selectively etching the amorphous silicon film, the metal silicide film and the silicon film in this order; and diffusing the impurity in the amorphous silicon film into the metal silicide film by a thermal process.

According to the present invention, by forming an electrode or an interconnect of a three-layer structure in which an amorphous silicon film containing an impurity is stacked on an electrode or an interconnect of a polycide structure, it is possible to cause the impurity to be supplied from the amorphous silicon film on the silicide film to the silicide film. Thus, the advantages are that the supply of the impurity which was necessary in the ion-implantation in the prior art method is no longer necessary, and the lowering of the transistor characteristics caused by ion-implantation and the occurrence of halation during the patterning process are prevented thereby improving the patterning precision.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

FIGS. 2A–2D shows a semiconductor device in cross sections for explaining sequential steps of a method for fabrication according to a first embodiment of the invention.

Figure 1A:
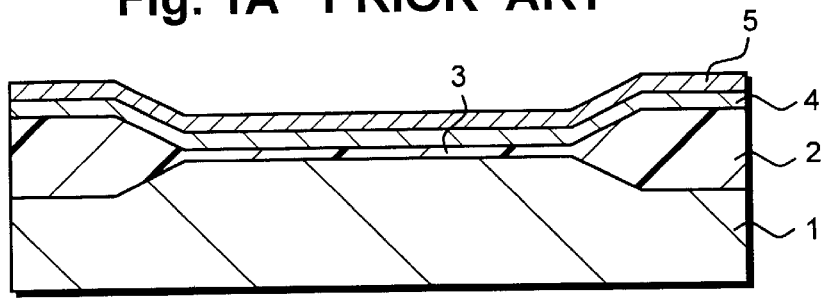
FIGS. 1A, 1B, 1C and 1D are sectional views of a prior art semiconductor device for explaining sequential steps of a method for fabricating the same.
Figure 1B:
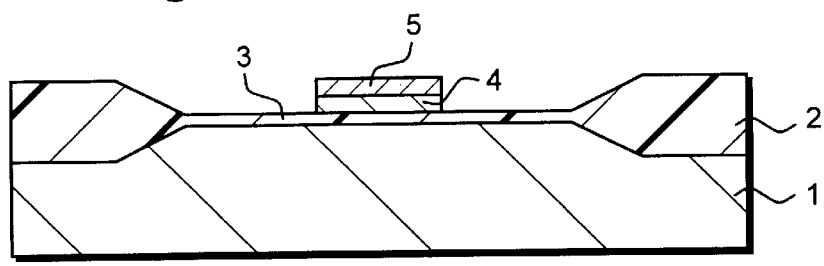
Figure 1C:
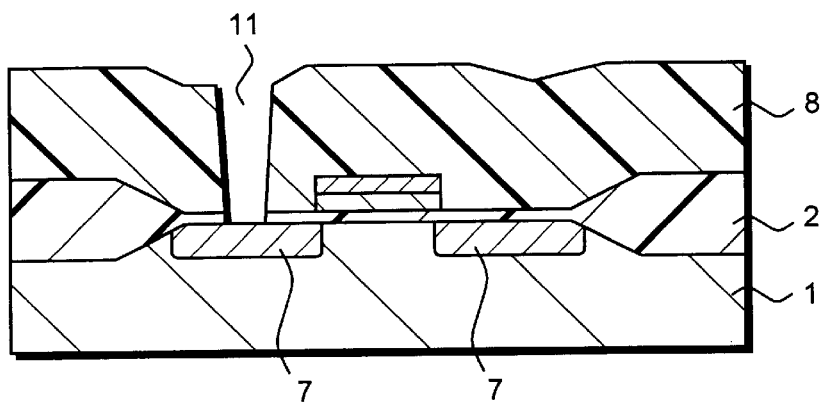
Figure 1D:
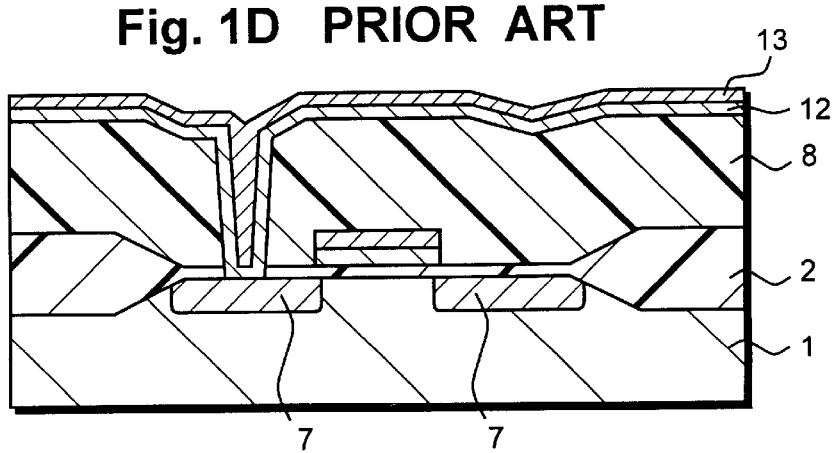
Figure 2A:
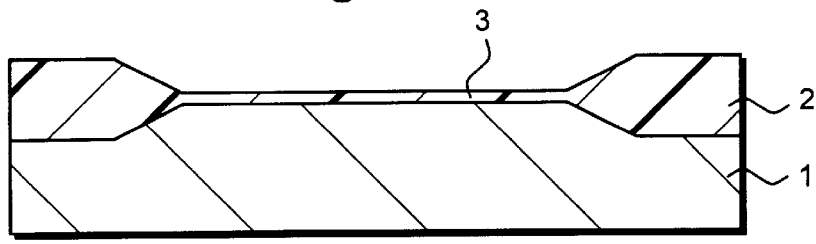
FIGS. 2A, 2B, 2C and 2D are sectional views of a semiconductor device for explaining sequential steps of a method for fabricating the same as a first embodiment according to the present invention.

First, as shown in FIG. 2A, a surface of a P-type silicon substrate 1 is locally oxidized so as to form a field oxide film 2 of 0.3 μm thick and to isolate an element formation region. Then, a surface of the silicon substrate 1 of the element formation region is thermally oxidized in the oxidizing atmosphere at 700–900° C. whereby a gate oxide film 3 of 10 nm thick is formed.

Figure 2B:
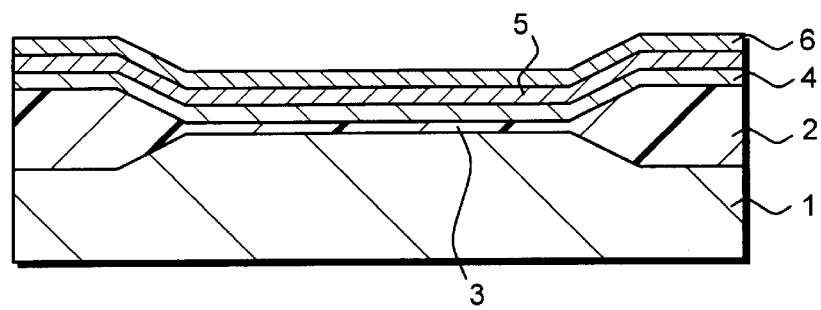

Then, as shown in FIG. 2B, a silicon film 4 of 0.1 μm thick in which phosphorus is doped on the entire surface including a surface of the gate oxide film 3 is formed. Here, the silicon film 4 may either be a polycrystalline silicon film or an amorphous silicon film. Next, a tungsten silicide film 5 of 0.1 μm thick is deposited on the silicon film 4 by a sputtering method and, on this tungsten silicide film 5, an amorphous silicon film 6 of 0.1 μm thick containing phosphorus with an impurity concentration of $5 \times 10^{20}$ cm$^{-3}$ is formed by a low pressure CVD process. This amorphous silicon film 6 is grown as a phosphorus doped amorphous silicon film which is uniformly formed between wafers, and this is achieved by forming a silicon film containing phosphorus by, for example, using a vertical CVD system and introducing into a reaction chamber, at a temperature of about 530° C., a 100% SiH$_4$ gas of 1 SLM under a reduced pressure of about 2.0 Torr and a PH$_3$ gas of about 100 SCCM with 1% N$_2$ being diluted. The widely ranging phosphorus concentration, that is, $1 \times 10^{19}$ –$1 \times 10^{21}$ cm$^{-3}$ can be controlled only by changing the flow rate of the PH$_3$ gas with almost no changes in the film formation speed.

Figure 2C:
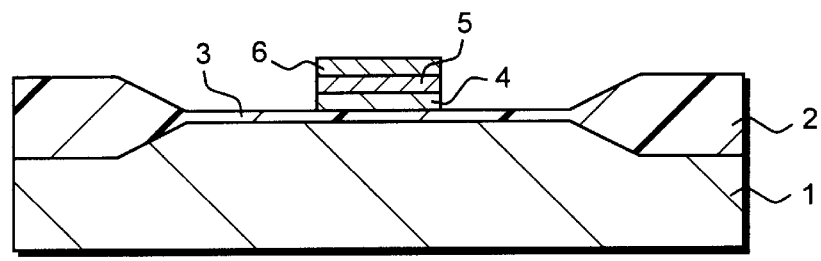

Next, as shown in FIG. 2C, the amorphous silicon film 6, the tungsten silicide film 5 and the silicon film 4 are selectively etched in this sequence whereby a gate electrode of a polycide structure is formed.

Figure 2D:
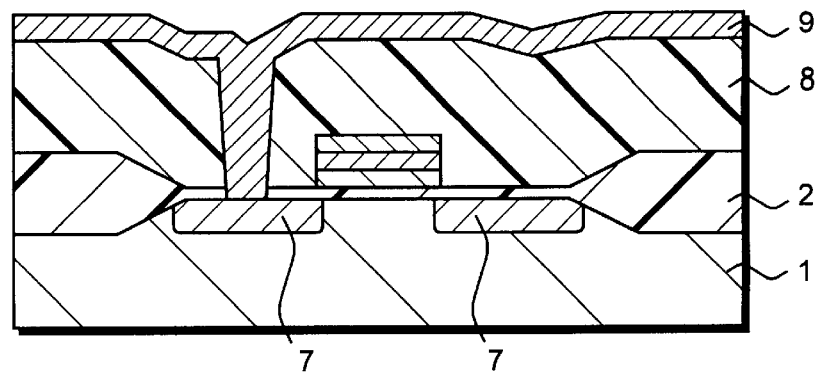

Thereafter, as shown in FIG. 2D, N-type impurity ions are implanted into the silicon substrate 1 using the gate electrode and the field oxide film 2 as masks thereby forming a diffusion layer 7 to become a source/drain region. Then, after an interlayer insulating film 8 is deposited on the entire surface including a surface of the gate electrode, a contact hole is formed by selectively etching the interlayer insulating film 8 on the diffusion layer 7, and an interconnect 9 to be in contact with the diffusion layer of the contact hole is selectively formed.

Here, the phosphorus contained in the gate electrode of the polycide structure is diffused from the phosphorus doped amorphous film 6 into the tungsten silicide film 5 due to the thermal process in a subsequent step. However, since the amorphous silicon film 6 contains a sufficient amount of phosphorus, the diffusion of the phosphorus into the tungsten silicide 5 is at a sufficient level so that the tungsten silicide 5 is saturated. Thus, there no possibility for the phosphorus concentration of the silicon film 4 underneath the tungsten silicide film 5 to suffer from an extreme reduction.

In the gate electrode of the polycide structure formed according to this embodiment of the invention, the source of the impurity diffusion is the amorphous silicon film containing the impurity at a high concentration so that there is no need to make ion-implantation onto the silicide film. Thus, the method according to this embodiment has no adverse effect to the gate oxide film and, as compared with the case wherein the conventional ion-implantation method is used, the failure rate of the breakdown voltage of the gate oxide film has been reduced by about 30%.

Further, since the amorphous silicon film has an absorption coefficient of about 1.5 times that of the silicon film with respect to the light of i-ray wavelength (365 nm) used in an ordinary reduction projection exposure system, it is possible to reduce the reflecting light intensity at the amorphous silicon film surface thereby suppressing the occurrence of halation.

Figure 3A:
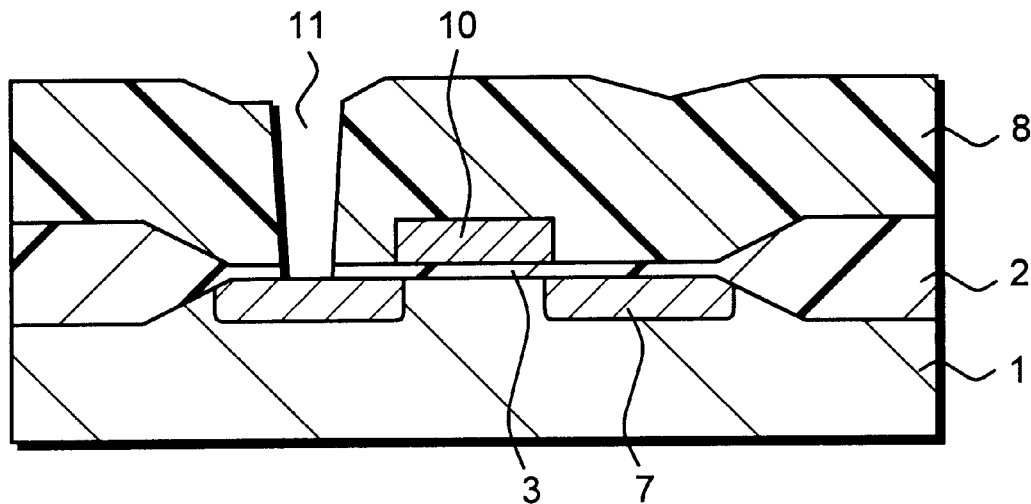
FIGS. 3A and 3B are sectional views of a semiconductor device for explaining steps of a method for fabricating the same as a second embodiment according to the present invention.
Figure 3B:
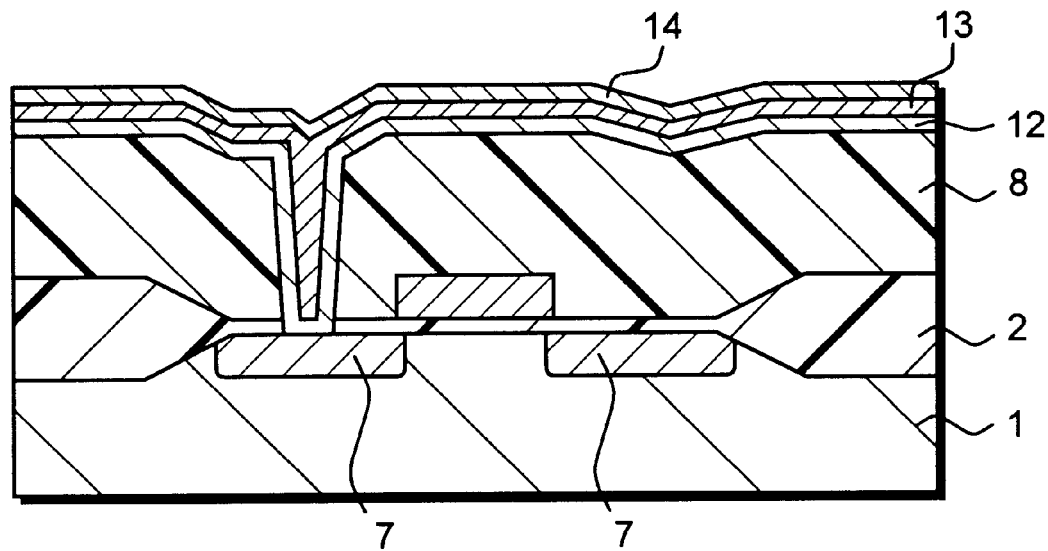

FIGS. 3A and 3B are sectional views for showing sequential steps of a method for fabricating a semiconductor device of a second embodiment according to the invention.

First, as shown in FIG. 3A, a gate oxide film 3 is formed on a surface of the element formation region defined by the element isolation field oxide film 2 formed by the local oxidation of the surface of the silicon substrate 1, and a gate electrode 10 is formed selectively on the gate oxide film 3. Then, after a diffusion layer 7 is formed by ion-implanting impurities using the gate electrode 10 and the field oxide film 2 as masks, an interlayer insulating film 8 of 1 μm thick is deposited on the entire surface including a surface of the gate electrode 10, and a contact hole 11 of 0.4 μm in a diameter of the upper end opening and 0.25 μm in a diameter of the bottom portion is formed by dry-etching the interlayer insulating film 8 above the diffusion layer 7.

Next, as shown in FIG. 3B, after a polycrystalline silicon film 12 containing phosphorus is deposited to a thickness of 0.1 μm on a surface of the interlayer insulating film 8 including a surface of the contact hole 11 by a low pressure CVD, a tungsten silicide film 13 is deposited to a thickness of 0.1 μm and, on this film, an amorphous silicon film 14 containing phosphorus with impurity concentration of about $5 \times 10^{20}$ cm$^{-3}$ is deposited to a thickness of 0.1 μm, and the amorphous silicon film 14, the tungsten silicide film 13 and the polycrystalline silicon film 12 are selectively dry-etched in this sequence whereby an interconnect connected to the diffusion layer 7 is formed. In this interconnect, as in the first example, since the phosphorus is diffused from the phosphorus doped amorphous silicon film 14 to the tungsten silicide film 13 during a subsequent thermal process and this diffusion is saturated, there is no possibility for the phosphorus concentration of the polycrystalline silicon film 12 to be lowered.

The interconnect thus formed does not require ion-implantation of phosphorus to its silicide film so that unnecessary phosphorus does not extend to the diffusion layer portion and any change in characteristics of a transistor disposed thereunder is extremely small with the improvement being that variations of threshold voltages of the transistor are reduced to less than half of those in the prior art. As compared with the case where the patterns are formed on the silicide film, halation can be suppressed and the patterning precision can be enhanced similarly as in the first embodiment.

For this second embodiment, the explanation has been made with an example wherein phosphorus is used as the impurity, but the invention is not limited thereto. Where arsenic (As) is used instead, by using a gas of $SiH_4$, of $Si_2H_6$ and $AsH_3$, etc., an arsenic doped amorphous silicon film may be formed as a film which serves both as an impurity diffusion source and a reflection prevention film. Also, where boron (B) is used as a P-type impurity, a boron doped amorphous silicon film can be formed by using $SiH_4$ or $Si_2H_6$ and $B_2H_6$, Also, for the metal silicide film, it is possible to use, instead of the tungsten silicide, a high melting point silicide film such as a titanium silicide and a molybdenum silicide.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a semiconductor device comprising the steps of:

forming a layered structure by sequentially forming a doped silicon film containing a first impurity, a metal silicide film, and an amorphous silicon film containing a second impurity which is the same as the first impurity, wherein said layered structure is not doped by ion implanting;

forming a three-layer structure by selectively etching said amorphous silicon film, said metal silicide film and said silicon film in this order; and diffusing said impurity in said amorphous silicon film into said metal silicide film by a thermal process.

2. A method for fabricating a semiconductor device according to claim 1, in which said three-layer structure constitutes an electrode of a polycide structure.

3. A method for fabricating a semiconductor device according to claim 1, in which said three-layer structure constitutes an interconnect of a polycide structure.

4. A method for fabricating a semiconductor device according to claim 1, in which said amorphous silicon film has a second impurity concentration of $2 \times 10^{20} - 5 \times 10^{20}$ cm$^{-3}$.

5. A method for fabricating a semiconductor device according to claim 1, in which said metal silicide film is a tungsten silicide film.

6. A method for fabricating a semiconductor device according to claim 1, in which the metal silicide film comprises a titanium silicide film.

7. A method for fabricating a semiconductor device according to claim 1, in which the metal silicide film comprises a molybdenum silicide film.

8. A method for fabricating a semiconductor device according to claim 1, in which the first impurity is phosphorous.

9. A method for fabricating a semiconductor device according to claim 4, in which the second impurity is phosphorous.

10. A method for fabricating a semiconductor device according to claim 1, in which the first impurity is boron.

11. A method for fabricating a semiconductor device according to claim 1, in which the first impurity is arsenic.

12. A method for fabricating a semiconductor device according to claim 1, in which the silicon film having a first impurity comprises an amorphous film.

13. A method for fabricating a semiconductor device according to claim 1, in which the silicon film having a first impurity comprises a polycrystalline silicon film.

14. A method for fabricating a semiconductor device according to claim 1, in which the amorphous silicon film containing a second impurity is formed at a temperature of about 530° C.

15. A method for fabricating a semiconductor device according to claim 14, in which the amorphous silicon film containing a second impurity is formed using $SiH_4$ as a film formation gas and $PH_3$ as a dopant gas.

16. A method for fabricating a semiconductor device according to claim 5, in which the amorphous silicon film containing a second impurity is formed at a temperature of about 530° C.

17. A method for fabricating a semiconductor device according to claim 16, in which the amorphous silicon film containing a second impurity is formed using $SiH_4$ as a film formation gas and $PH_3$ as a dopant gas.

* * * * *

UNITED STATES PATENT AND TRADEMARK OFFICE
CERTIFICATE OF CORRECTION

PATENT NO.: 6,074,925
DATED: June 13, 2000
INVENTOR(S): Fumiki AISOU

It is certified that error(s) appears in the above-identified patent and that said Letters Patent is hereby corrected as shown below:

Column 6, line 3 & 4, delete "cm$^{31}$ $_3$" insert -- $^{-3}$ --.

Signed and Sealed this

Eighth Day of May, 2001

Attest:

NICHOLAS P. GODICI

Attesting Officer    Acting Director of the United States Patent and Trademark Office